United States Patent [19]

Masumoto et al.

[11] Patent Number: 4,944,183
[45] Date of Patent: Jul. 31, 1990

[54] LEVEL GAUGE FOR LIQUID HELIUM

[75] Inventors: Tsuyoshi Masumoto; Akihisa Inoue; Kunio Matsuzaki, all of Sendai; Masami Ishii; Ryohei Yabuno, both of Toyota; Tetsuo Oka, Toyoake, all of Japan

[73] Assignee: Aisin Seiki Kabushiki Kaisha, Japan

[21] Appl. No.: 277,379

[22] Filed: Nov. 29, 1988

[51] Int. Cl.⁵ .................. C22C 28/00; J01F 23/24; H01B 12/00; G01K 7/00
[52] U.S. Cl. .................. 73/295; 374/176; 420/901; 505/1; 505/805; 505/847
[58] Field of Search .................. 73/295; 374/176; 420/901; 505/805, 842, 847, 1

[56] References Cited

U.S. PATENT DOCUMENTS

| | | | |
|---|---|---|---|
| 3,267,730 | 8/1966 | Satterthwaite et al. | 73/295 |
| 3,408,604 | 10/1968 | Toshio Dio et al. | 420/901 X |
| 3,912,611 | 10/1975 | Royer et al. | 338/307 X |
| 4,655,079 | 4/1987 | Masumoto et al. | 73/295 |
| 4,745,806 | 5/1988 | Masumoto et al. | 505/805 X |
| 4,808,488 | 2/1989 | Chevrel et al. | 174/125.1 |

OTHER PUBLICATIONS

"Superconductivity in Amorphous Alloys", by Kinzoko, vol. 49 (12), 1979, pp. 24–32-Inoue, A. et al., (attached pp. 1–28).
"N.M.R. Study on ³¹P In An Amorphous Superconducting $(MO_{0.5}Ru_{0.5})_{80}P_{20}$ Alloy", D. A. Guerra et al., Solid States Communications-vol. 31, pp. 487–491, 1979.
"Pressure Dependence of the Superconductig Transition Temperature of a $(Mo_{0.6}Ru_{0.4})_{86}B_{14}$ Metallic Glass", FP. Missell et al., Solid State Communications, vol. 40, pp. 379–381, 1981.

Primary Examiner—Daniel M. Yasich
Attorney, Agent, or Firm—Banner, Birch, McKie & Beckett

[57] ABSTRACT

A level gauge and measurement method are provided using a sensing element comprising a superconductive alloy represented by the formula:

$$Mo_a Ru_b Z_c$$

wherein Z is phosphorous, boron, or a mixture of phosphorous and boron,
  b has a value of about 20 to about 40,
  c has a value of about 10 to about 30, and
  $a+b+c=100$.

The sensing element has a superconductivity critical temperature of at least 4.2K and is useful for measuring the level of liquid helium independently of pressure fluctuations in the reservoir vessel.

8 Claims, 2 Drawing Sheets

LEVEL GAUGE FOR LIQUID HELIUM

BACKGROUND OF THE INVENTION

1. Field of the Invention

The present invention relates to a level gauge for detecting a level of liquid helium which is accommodated in a container made of metals, glasses or other materials. More particularly, the invention relates to a level gauge for detecting a level of liquid helium which uses, as a sensing element, a wire made of an amorphous superconductive alloy obtained by rapid by quenching a molten alloy. The level of liquid helium is detected by measuring an electric current, voltage and/or electric resistance of the sensor element.

2. Description of Related Technology

Liquid helium level gauges that use superconducting alloy sensing elements rely on the electrical resistance changes of the element to indicate liquid level. The portion of the element submerged in the liquid becomes superconductive, i.e. no resistance to electrical current. The portion above the liquid is not superconductive and resists electrical flow at a constant rate over its length. If the sensing element is homogeneous, has a constant width, and has a constant thickness, the resistance properties will be constant over the length of the sensor element. By passing an electrical current through the submerged element, measuring the electrical current, and comparing the value to a calibration relationship, the level of the helium can be determined.

In the level gauge disclosed in U.S. Pat. No. 4,655,079 (which is herein incorporated by reference), the superconductive alloy is represented by the following formula:

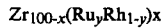
$$Zr_{100-x}(Ru_yRh_{1-y})_x$$

wherein x represents the contents of Ru and/or Rh in aomic % and has a numeral value of $22.5 < x < 27.5$; and y represents a numerical value of $0 < y < 1$.

However, the superconducting transition temperature (Tc) of that superconductive alloy ranges from 4.2K to 4.5K. This transition temperature is quite close to the temperature of liquid helium (4.2K). As the pressure in the storage vessel changes, the accuracy of the level measurements can decrease.

SUMMARY OF THE INVENTION

It is, therefore, a principal object of the present invention to provide a level gauge for detecting the level of liquid helium without accuracy fluctuation due to storage vessel pressure changes. Other objects will become apparent from the description herein.

The invention relates to a level gauge comprising:
A sensing element comprising a superconductive alloy represented by the formula:

$$Mo_aRu_bZ_c$$

wherein
Z is phosphorous, boron, or a mixture of phosphorous and boron,
b has a value of about 20 to about 40,
c has a value of about 10 to about 30, and
$a+b+c=100$;
means for passing an electrical current through said sensing element; and
means for detecting an indicia of the electrical current passing through said sensing element.

The sensing element has a superconductivity critical temperature ($T_c$) of at least 4.2K, preferably at least 4.5K, and more preferably at least 5.0K. The $T_c$ is greater than the liquid helium temperature which assures superconductive properties despite slight pressure changes in the reservoir vessel.

The amorphous alloy of the invention may be made by rapidly quenching a molten mixture of the elements.

As used herein, the detecting or measuring an indicia of electric current passing through the sensing element is a phrase intended to include both direct and indirect methods of measuring current. Direct measuring techniques include induction coils. Indirect techniques include, inter alia, voltage differences, resistance changes, and thermographic analysis. For the sake of clarity, the term "electrical current" will be used to denote all of the above forms of measurement and their functional equivalents.

DETAILED DESCRIPTION OF THE INVENTION

For convenience and clarity, the invention will be described in detail using the attached drawing Figures. It should be understood that the figures are not to scale and are intended only as a tool for describing the various structural relationships.

Figure 1:
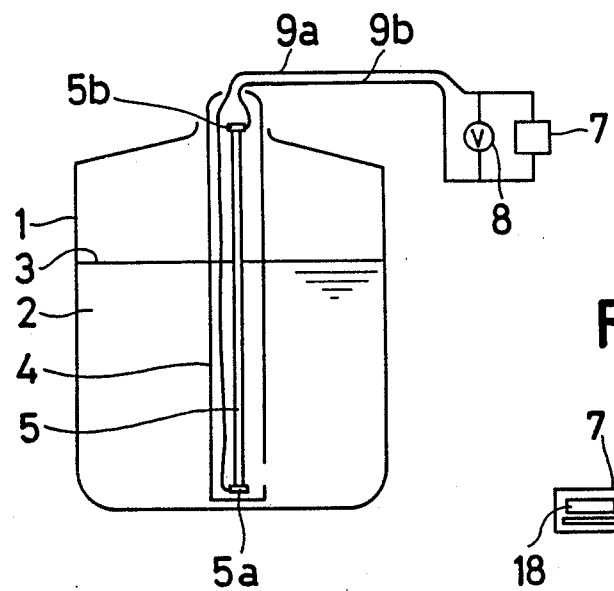
FIG. 1 is a schematic view of a level gauge according to the present invention.
Figure 2:
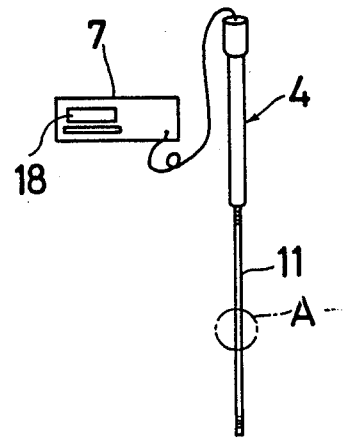
FIG. 2 illustrates an external view of a level gauge having a casing with a step gradation in the diameter and openings for communication to the enclosed sensing element.

FIG. 1 illustrates a level gauge which includes a measuring unit 4 which can be immersed in liquid helium 2 having a liquid level 3 in vessel 1. An elongated, ribbon-shaped sensing element 5 made of superconductive alloy is disposed in casing 11 of measuring unit 4. Sensing element 5 is connected at lower end 5a and upper end 5b with insulated electrical lines 9a and 9b respectively. The other ends of lines 9a and 9b are connected to DC power circuit and display unit 7 which includes a battery or DC converter for AC power so that sensing element 5 may be supplied with an electric current over its entire length. An electrical current sensing means such as voltmeter 8 is connected in parallel to sensing element 5 to measure the electrical current produced by power circuit and display unit 7.

Level 3 of liquid helium 2 can be measured indirectly or directly by the electrical resistance of sensing element 5. When a room temperature (20° C.) sensing element 5 is supplied with an electrical current, voltmeter 8 would indicate a low voltage due to the high resistance of element 5 over its entire length. When immersed completely in liquid helium, voltmeter 8 would register at substantially the voltage of the DC power source because sensing element 5 would have a zero electric resistance over its entire length. Lesser immersion levels will produce a voltage reading somewhere between the lowest voltage (highest resistance at 20° C.) and the highest voltage (lowest resistance at liquid helium temperature). This intermediate voltage will be proportional to the immersed length of sensing element 5 and thereby reflect the liquid height. Power circuit and display unit 7 can be programmed to perform appropriate conversions on the actual voltage reading and will display the liquid helium level with display 18.

Sensing element 5 in measuring unit 4 may be inserted into helium 2 at virtually any predetermined angle. A substantially vertical insertion is preferred. Appropriate internal supports will be used to support sensing element 5 throughout the length of casing 11.

The sensing element 5 should use a superconductive alloy having a superconductivity critical temperature of at least 4.2K. and preferably at least 4.5K. A superconductivity critical temperature above the temperature of liquid helium will assure that the inserted portion becomes superconductive, i.e. about 4.2K, upon insertion and will also provide security that pressure fluctuations will not affect the accuracy of the measurements.

Figure 3:
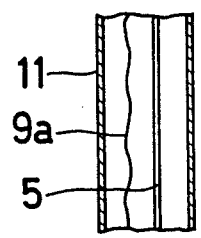
FIG. 3 is a vertical sectional view of a portion indicated by A in FIG. 2.
Figure 4:
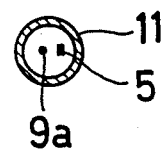
FIG. 4 is a horizontal view of a portion indicated by A in FIG. 2.

FIGS. 3 and 4 illustrate line 9a and sensing element 5 in casing 11. Element 5 may be off-center (as shown) or substantially in the center of casing 11. Wire 9a may be located anywhere with respect to casing 11 but should be laterally displaced from sensing element 5 except where connected at lower end 5a and upper end 5b. Wire 9a may be connected to element 5 if suitable insulating and attachment provisions can be made to ensure that the temperature and dimensional stability of element 5 are not compromised.

EXAMPLE 1

The following sensing element was used in a level gauge according to the invention:
(1) Width: 0.5 mm
(2) Thickness: 20 microns
(3) Length: 6 m
(4) Composition: $Mo_{48}Ru_{32}B_{20}$
(5) $T_c$: 6.67K
(6) Ratio-Resistance: 158 micro Ohm/cm
(7) Resistance-Temperature Coefficient: 240 ppm/°C.
(8) Resistance of Element 5 and Wires 9a/9b: 115 Ohms at 20° C.

The sensing element was placed in a liquid helium reservoir and supplied with 110 mA of current. The resistance of the inserted sensing element with connections was 93 Ohms.

Figure 5:
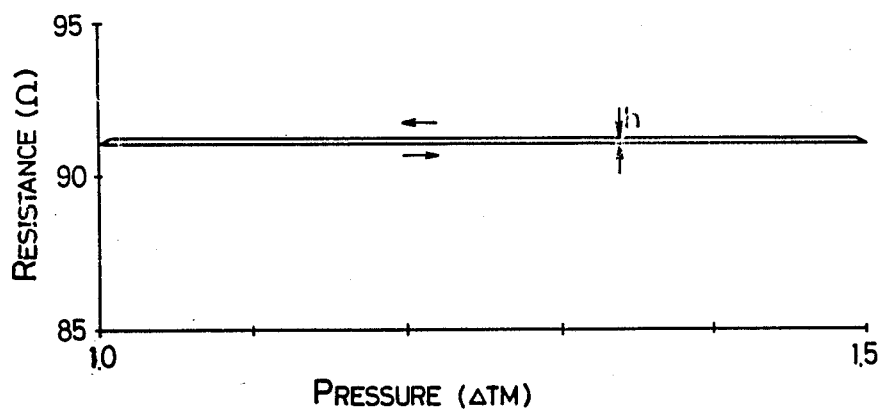
FIG. 5 is a graph showing the relationship between the resistance and the pressure with respect to the instant level gauge.

The pressure in the liquid helium reservoir was varied from 1.0 to 1.5 atm. As shown in FIG. 5, only a negligible hysteresis (h) occurs. The sensing element remains accurate despite the pressure changes.

EXAMPLE 2

The level sensor is likewise unaffected by magnetic field changes. The sensor of Example 1 was subjected to a magnetic field change from 0 to 44 kG around the helium reservoir. The magnetic field was varied at the rate of 2 kG/sec. The sensor current was 110 mA.

Figure 6:
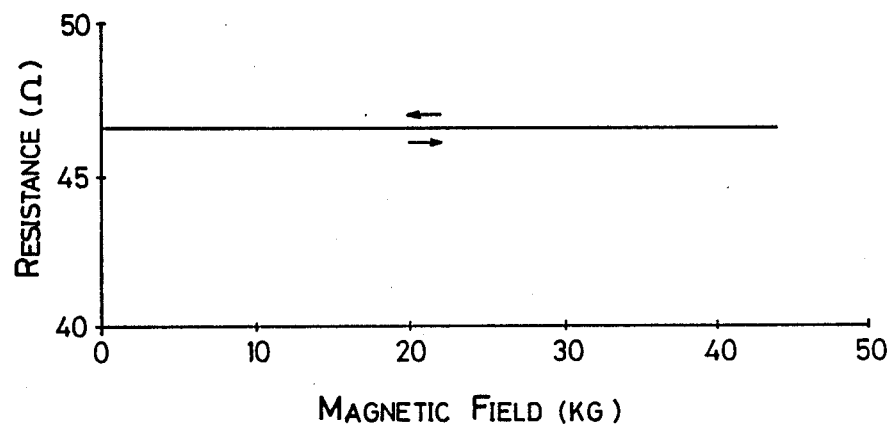
FIG. 6 is a graph showing the relationship between the resistance and the variation in magnetic field with respect to the instant level gauge.

As shown in FIG. 6, the resistance of the sensor did not vary with a change in the magnetic field. The sensor element would be useful, therefore, in applications involving changing magnetic fields, e.g. superconductive magnet helium level monitoring systems.

EXAMPLE 3

Other amorphous molybdenum superconductive alloys of the invention were tested for superconductive transition temperature and critical magnetic field. These are shown in Table 1.

TABLE 1

| Composition | $Mo_a Ru_b P_c$ | $Mo_a Ru_b B_c$ |
|---|---|---|
| a (mole percentage) | 40–60 | 35–60 |
| b (mole percentage) | 30–40 | 30–40 |
| c (mole percentage) | 10–20 | 10–25 |
| $T_c$ (K) | 6.2–7.3 | 5.1–7.1 |
| Critical magnetic field (kG) | 48–80 | 40–80 |

It should be understood that the scope of the invention is not limited to the exemplified compositions. There are many variations from the examples which are within the scope and spirit of the appended claims. These variations will be clear to others in this art from reading the specifications above.

We claim:

1. A level gauge comprising:
a sensing element comprising a superconductive alloy represented by the formula:

$$Mo_aRu_bZ_c$$

wherein

Z is phosphorous, boron, or a mixture of phosphorous and boron, b has a value of about 32, c has a value of about 20, and a+b+c=100;

means for passing an electrical current through said sensir element; and means for detecting an indicia of the electric current passing through said sensing element.

2. A level gauge according to claim 1 wherein said alloy has a superconductivity critical temperature of at least 4.2K.

3. A level gauge according to claim 1 wherein said alloy has a superconductivity critical temperature of at least 4.5K.

4. A level gauge according to claim 1 wherein said alloy has a superconductivity critical temperature of at least 5.0K.

5. A method for measuring the height of liquid helium in a vessel, said method comprising:
inserting an sensing element at least partially into a volume of liquid helium at a liquid height in a vessel, said element comprising a superconductive alloy represented by the formula:

$$Mo_aRu_bZ_c$$

wherein

Z is phosphorous, boron, or a mixture of phosphorous and boron, b has a value of about 32, c has a value of about 20, and a+b+c=100;

passing an electrical current through said sensing element; and measuring an indicia of the electrical current passing through said sensing element.

6. A method according to claim 5 further comprising calculating the liquid height of said liquid helium in response to the indicia measurement; and displaying said liquid height.

7. A method according to claim 5 wherein the inserting is in a substantially vertical direction.

8. A superconductive alloy represented by the formula:

$$Mo_a Ru_b Z_c$$

wherein
Z is phosphorous, boron, or a mixture of phosphorous and boron,
b has a value of about 32,
c has a value of about 20, and
$a+b+c=100$.

* * * * *